United States Patent
Chung et al.

(10) Patent No.: US 11,022,866 B2
(45) Date of Patent: Jun. 1, 2021

(54) PROJECTION DEVICE CAPABLE OF IMPROVING HEAT DISSIPATION EFFECT

(71) Applicant: Coretronic Corporation, Hsin-Chu (TW)

(72) Inventors: Wen-Yen Chung, Hsin-Chu (TW); Jhih-Hao Chen, Hsin-Chu (TW); Tsung-Ching Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 40 days.

(21) Appl. No.: 16/525,603

(22) Filed: Jul. 30, 2019

(65) Prior Publication Data

US 2020/0041884 A1    Feb. 6, 2020

(30) Foreign Application Priority Data

Aug. 3, 2018 (CN) .......................... 201821244407.9

(51) Int. Cl.
*G03B 21/16* (2006.01)
*G02B 21/00* (2006.01)
(Continued)

(52) U.S. Cl.
CPC ........... *G03B 21/16* (2013.01); *G03B 21/008* (2013.01); *G03B 21/145* (2013.01); *G03B 21/20* (2013.01);
(Continued)

(58) Field of Classification Search
CPC .... G03B 21/16; G03B 21/008; G03B 21/145; G03B 21/20; H05K 7/20145; H05K 7/20154; H05K 7/20172; H05K 7/20336
See application file for complete search history.

(56) References Cited

U.S. PATENT DOCUMENTS 6,751,027 B2 *  6/2004  Van Den Bossche ....................... G03B 21/16 348/E9.027
7,726,820 B2 *  6/2010  Hara ...................... G03B 21/16 353/119

(Continued)

FOREIGN PATENT DOCUMENTS

CN    105159018    12/2015
CN    207249336     4/2018

*Primary Examiner* — Michelle M Iacoletti
*Assistant Examiner* — Magda Cruz
(74) *Attorney, Agent, or Firm* — JCIPRNET

(57) ABSTRACT

The invention provides a projection device including a housing, a light source module, an optical engine module, and a projection lens. The light source module includes a light source and a light source heat dissipation module. The light source heat dissipation module includes a light source dissipation fin. The optical engine module is located on a light transmission path of a light emitted from the light source. The optical engine module includes a light-modulating device and an optical engine dissipation fin. An extension direction of a supporting surface of the light-modulating device is parallel to an upper casing or an lower casing of the housing. The optical engine dissipation fin is disposed above the supporting surface of the light-modulating device. The light-modulating device is located between the optical engine dissipation fin and the light source dissipation fin. The projection lens is connected to the optical engine module.

20 Claims, 9 Drawing Sheets

(51) Int. Cl.
*G03B 21/14* (2006.01)
*G03B 21/20* (2006.01)
*G03B 21/00* (2006.01)
*H05K 7/20* (2006.01)

(52) U.S. Cl.
CPC ..... *H05K 7/20145* (2013.01); *H05K 7/20154* (2013.01); *H05K 7/20172* (2013.01); *H05K 7/20336* (2013.01)

(56) References Cited

U.S. PATENT DOCUMENTS

| | | | |
|---|---|---|---|
| 9,316,894 B2 | 4/2016 | Dai et al. | |
| 2002/0135741 A1* | 9/2002 | Lee | F21V 29/74 353/61 |
| 2002/0163627 A1* | 11/2002 | Ohishi | G03B 21/18 353/58 |
| 2007/0091276 A1* | 4/2007 | Zakoji | G03B 21/16 353/54 |
| 2008/0024733 A1* | 1/2008 | Gerets | G02F 1/133553 353/52 |
| 2008/0055563 A1* | 3/2008 | Momose | G03B 21/16 353/61 |
| 2009/0141248 A1 | 6/2009 | Suzuki | |
| 2010/0053896 A1* | 3/2010 | Chen | G03B 21/16 361/697 |
| 2011/0157560 A1* | 6/2011 | Hsiao | G03B 21/16 353/58 |
| 2014/0375964 A1* | 12/2014 | Tsuchiya | G02B 26/008 353/52 |
| 2017/0153769 A1* | 6/2017 | Miura | G06F 3/0418 |
| 2019/0171092 A1* | 6/2019 | Yamashita | G03B 21/145 |
| 2019/0364250 A1* | 11/2019 | Malfait | G02B 5/003 |

* cited by examiner

PROJECTION DEVICE CAPABLE OF IMPROVING HEAT DISSIPATION EFFECT

CROSS-REFERENCE TO RELATED APPLICATION

This application claims the priority benefit of China application serial no. 201821244407.9, filed on Aug. 3, 2018. The entirety of the above-mentioned patent application is hereby incorporated by reference herein and made a part of this specification.

BACKGROUND OF THE INVENTION

Field of the Invention

The disclosure relates to an optical device, and in particular, to a projection device.

Description of Related Art

In the current projection devices, the housing of the projection device has air inlets disposed on the front and rear sides thereof, and air outlets disposed on the left and right sides thereof. And speakers are disposed on the left and right sides of the housing and are located between the system fans (i.e., blowers) and the air outlets. Since the distance between the air outlets of blowers having high static-pressure and low airflow and the light-modulating device of the optical device module is small, wind shear is likely to occur and noise is generated. Moreover, to increase the airflow for cooling the light source module to meet the temperature requirement for the light source, two axial fans would be disposed on the front side of the light source module (i.e., at a position adjacent to the projection lens) in the current projection devices. However, as the distance between the light source module and the light-modulating device of the optical device module is not large, the light source module has to be tilted towards the rear plate of the housing to allow space for disposing the two axial fans. Since the light source module has to be tilted towards the rear plate of the housing, the overall volume of the projection device is increased, and the distance between the air inlets located on the rear plate and the projection screen is decreased, which reduces the air inlet, results in undesirable heat dissipation effect, and causes difficulty in installation of cables disposed on the rear plate of the housing. In addition, the two axial fans are located at midstream/upstream of the flow field. Therefore, it is necessary to add guide members at air outlets of the system to guide and discharge the airflow from the light source out of the system. As a result, the costs and flow resistance are increased, and system noise is also likely to increase. Furthermore, an 8-cm step difference is present between the condenser end and the evaporator end of the heat pipe for cooling the light-modulating device, and it is necessary to use two heat pipes to guarantee the heat dissipation function.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The invention provides a projection device that exhibits improved heat dissipation effect.

Other purposes and advantages of the embodiments of the invention may be further understood according to the technical features disclosed herein.

To achieve one, part, or all of the foregoing purposes or other purposes, an embodiment of the invention provides a projection device including a housing, a light source module, an optical engine module, and a projection lens. The housing includes an upper casing and a lower casing. The light source module is disposed inside the housing and includes a light source and a light source heat dissipation module connected to the light source. The light source heat dissipation module includes a light source dissipation fin. The optical engine module is disposed inside the housing and is located on a light transmission path of a light emitted from the light source. The optical engine module includes a light-modulating device and an optical engine dissipation fin. The light-modulating device is correspondingly supported on a supporting surface of the optical engine module, and an extension direction of the supporting surface is parallel to the upper casing or the lower casing of the housing. The optical engine dissipation fin is disposed above the supporting surface corresponding to the light-modulating device. The light-modulating device is located between the optical engine dissipation fin and the light source dissipation fin. The projection lens is disposed inside the housing and is connected to the optical engine module.

Based on the above, the embodiments of the invention at least exhibit one of the advantages or effects below. In the design of the projection device of the invention, the extension direction of the supporting surface corresponding to the light-modulating device is parallel to the upper casing or the lower casing of the housing, the optical engine dissipation fin is disposed above the supporting surface corresponding to the light-modulating device, and the light-modulating device is located between the optical engine dissipation fin and the light source dissipation fin. In other words, since the optical engine dissipation fin and the light source dissipation fin are not located on the same plane, there is a larger space for disposing the light source dissipation fin, and more and larger light source dissipation fins can be disposed to increase the heat dissipation area. Moreover, the optical engine dissipation fin is directly disposed above the light-modulating device. Therefore, it is not required to dispose a heat pipe to conduct heat as in the related art, and a decrease in the heat dissipation performance resulting from inverse gravity does not occur. In brief, the projection device of the invention exhibits improved heat dissipation effect.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
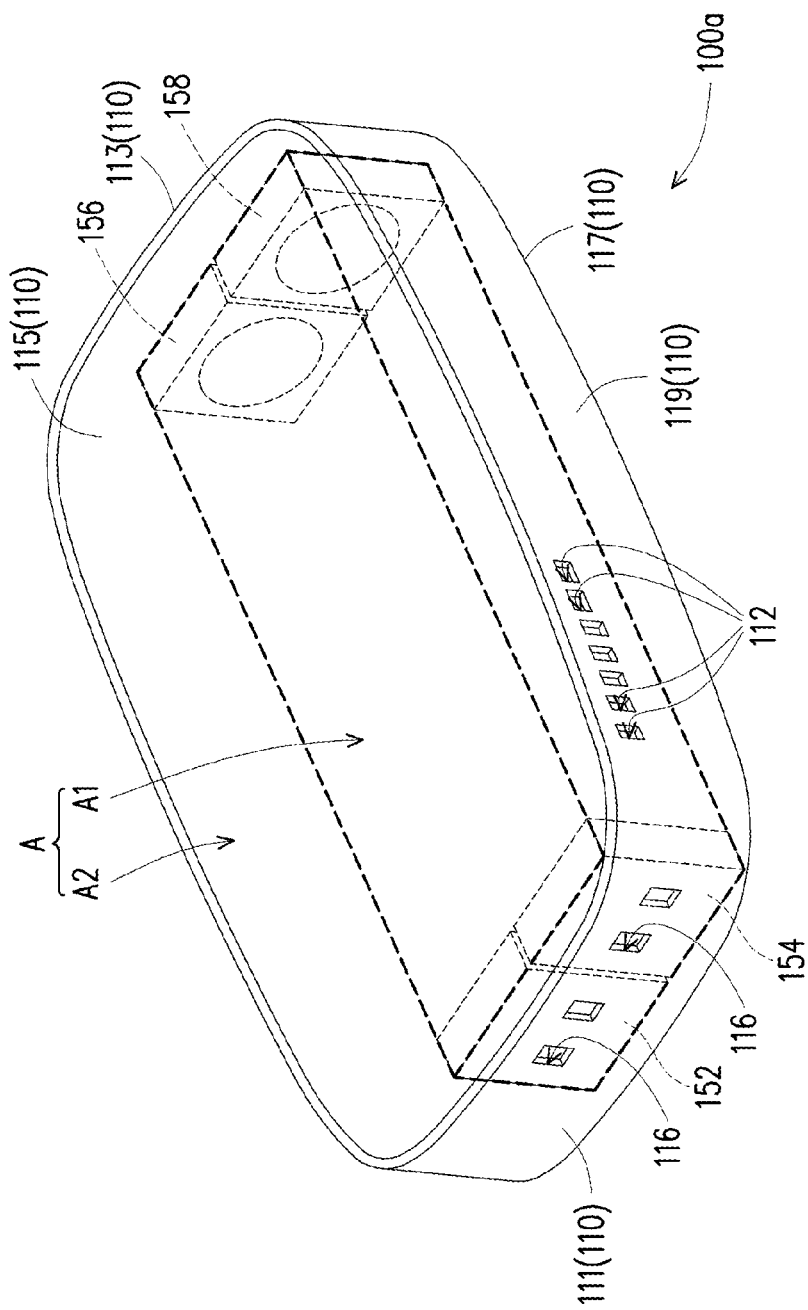
FIG. 1 is a partial perspective schematic diagram illustrating a projection device according to an embodiment of the invention.
Figure 2:
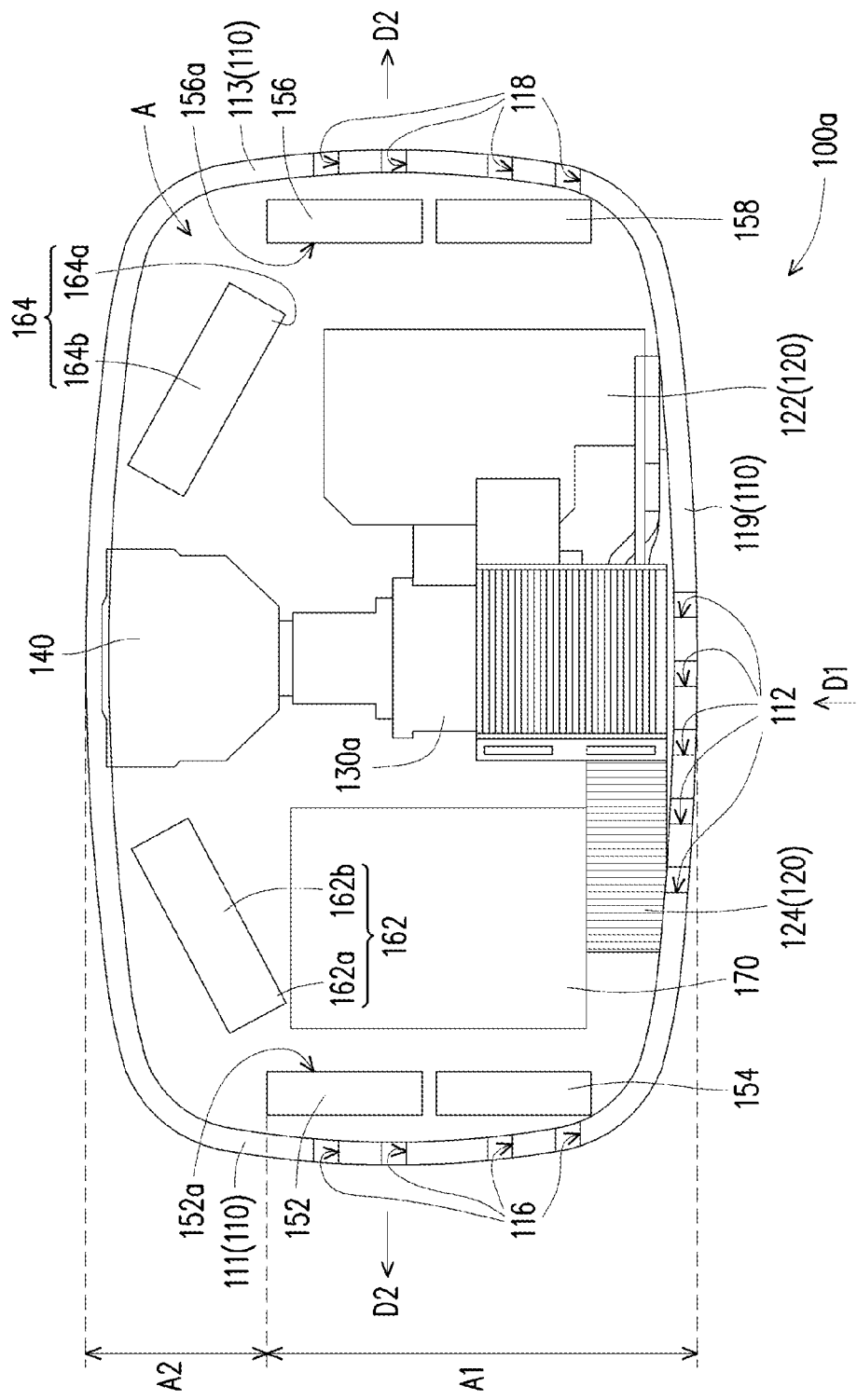
FIG. 2 is a top schematic diagram illustrating the projection device of FIG. 1.
Figure 3:
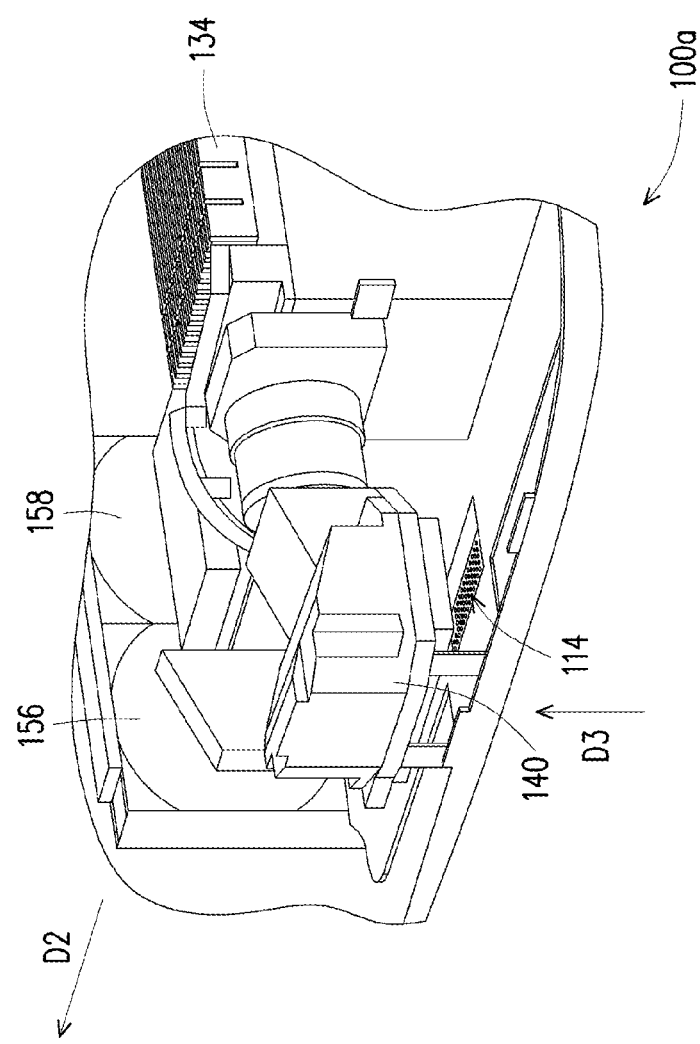
FIG. 3 is a partial three-dimensional diagram illustrating the projection device of FIG. 1 from a viewing angle.
Figure 4:
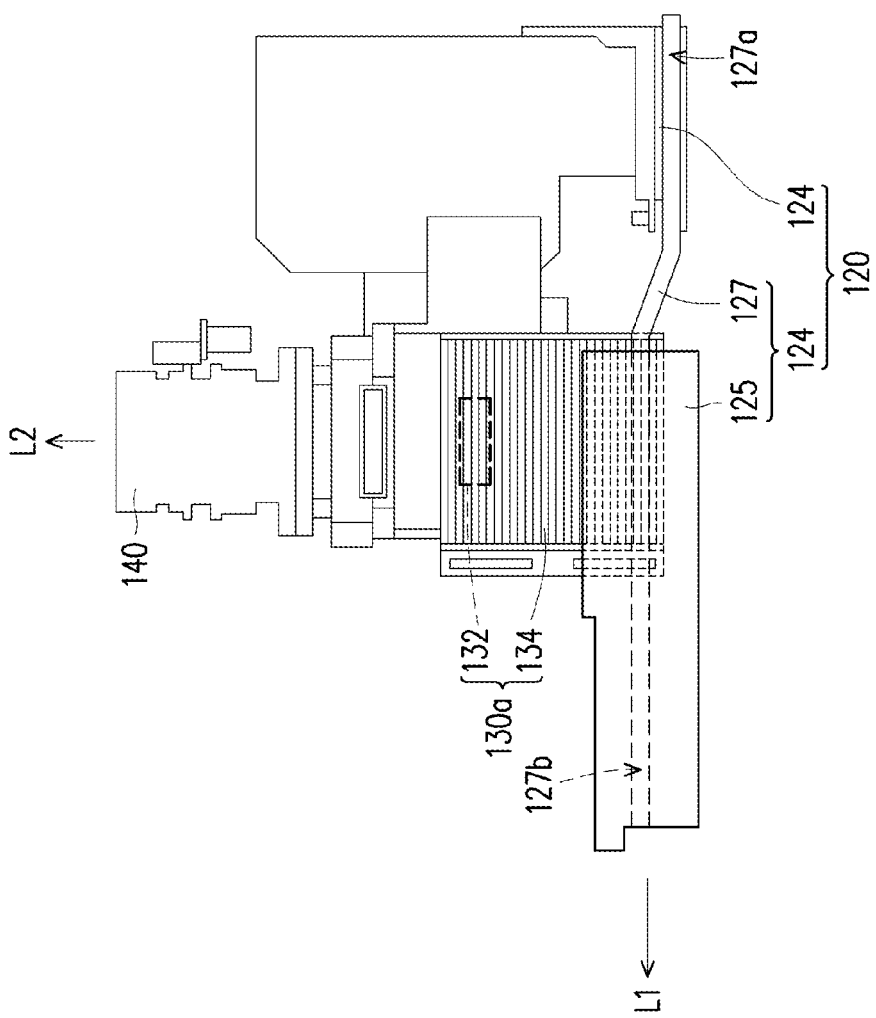
FIG. 4 is an enlarged schematic diagram illustrating the light source module, the optical engine module, and the projection lens of the projection device of FIG. 1.
Figure 5:
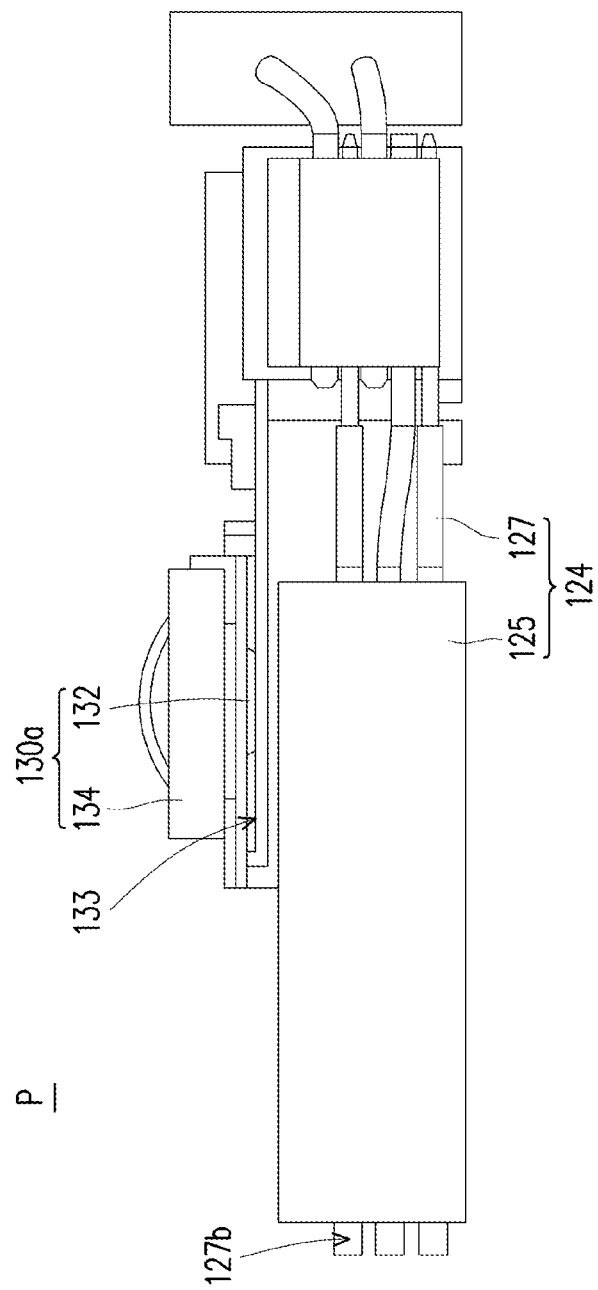
FIG. 5 is a rear schematic diagram illustrating the light source module and the optical engine module of the projection device of FIG. 1.
Figure 6:
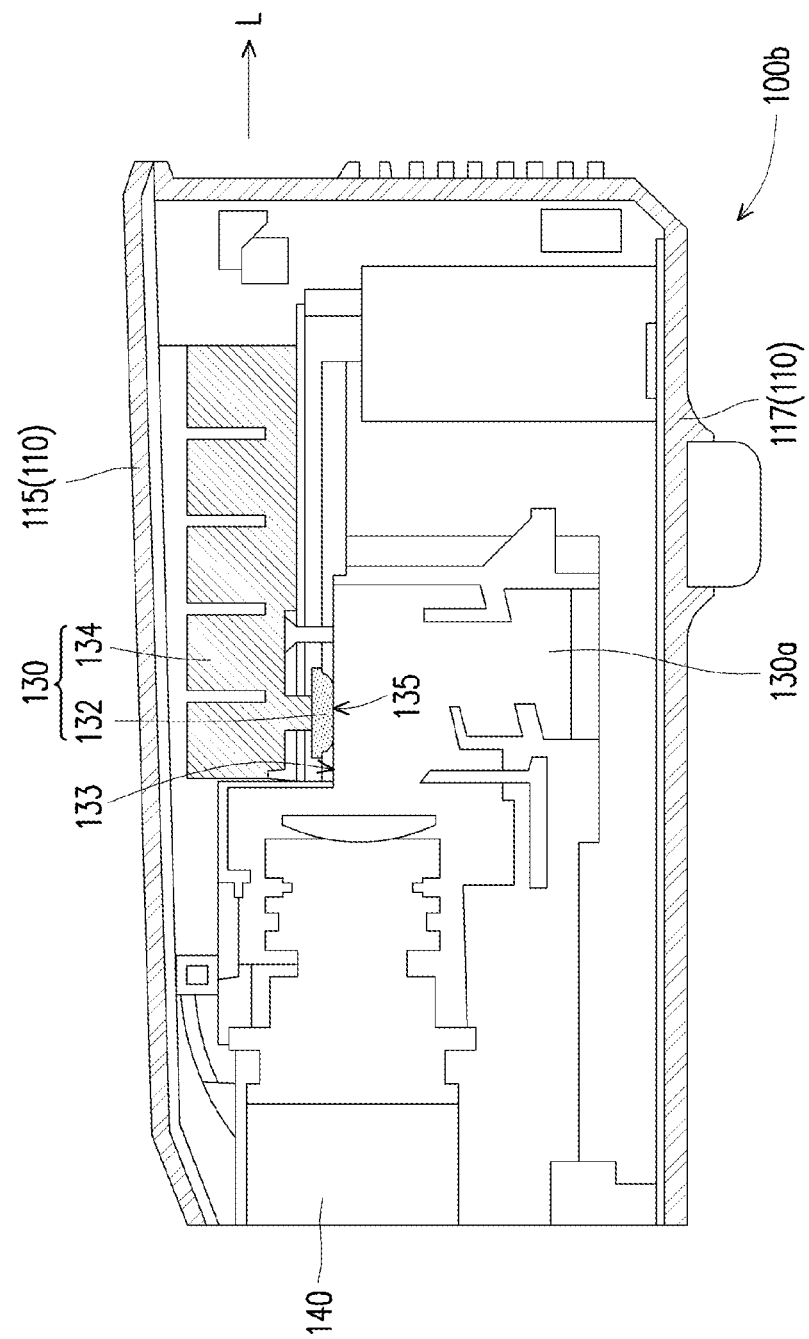
FIG. 6 is a cross-sectional schematic diagram illustrating the projection device of FIG. 1.
Figure 7:
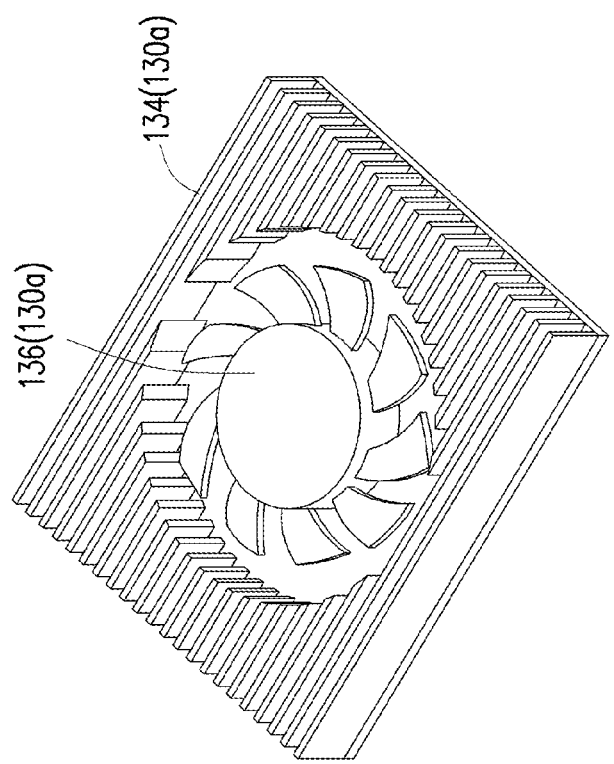
FIG. 7 is a schematic diagram illustrating the optical engine dissipation fin and the auxiliary fan in the optical engine module of the projection device of FIG. 1.

FIG. 1 is a partial perspective schematic diagram illustrating a projection device according to an embodiment of the invention. FIG. 2 is a top schematic diagram illustrating the projection device of FIG. 1. FIG. 3 is a partial three-dimensional diagram illustrating the projection device of FIG. 1 from a viewing angle. FIG. 4 is an enlarged schematic diagram illustrating the light source module, the optical engine module, and the projection lens of the projection device of FIG. 1. FIG. 5 is a rear schematic diagram illustrating the light source module and the optical engine module of the projection device of FIG. 1. FIG. 6 is a cross-sectional schematic diagram illustrating the projection device of FIG. 1. FIG. 7 is a schematic diagram illustrating the optical engine dissipation fin and the auxiliary fan in the optical engine module of the projection device of FIG. 1.

First, referring to FIG. 1, FIG. 2, and FIG. 3, in the embodiment, a projection device 100a includes a housing 110, a light source module 120, an optical engine module 130a, a projection lens 140, and a plurality of fans 152, 154, 156, 158. The housing 110 includes at least one air inlet (two are illustrated here, including a first air inlet 112 and a second air inlet 114) and a plurality of air outlets 116, 118. The air outlets 116, 118 are respectively located on a first side plate 111 and a second side plate 113 of the housing 110, which are opposite to each other. An airflow direction D1 of the first air inlet 112 is not parallel to an airflow direction D2 of the air outlets 116, 118. The light source module 120 is disposed inside the housing 110 and is located closely adjacent to the first air inlet 112. The optical engine module 130a is disposed inside the housing 110 and is located on a light transmission path of a light emitted from the light source module 120. The projection lens 140 is disposed inside the housing 110 and is connected to the optical engine module 130a to project light from the optical engine module 130a to outside the projection device 100a. The fans 152, 154, 156, 158 are disposed inside the housing 110. The fans 152, 154 are arranged closely adjacent to the air outlet 116, and the fans 156, 158 are arranged closely adjacent to the air outlet 118. In other words, no heat-generating element is disposed between the fans 152, 154, 156, 158 and the air outlets 116, 118. In an embodiment, the fans 152, 154, 156, 158 respectively include an air intake side and an air outflow side. The air intake side and the air outflow side of each of the fans 152, 154, 156, 158 are respectively located on two opposite sides of the fan. The air outflow sides of the fans 152, 154 face the air outlet 116, and the air outflow sides of the fans 156, 158 face the air outlet 118.

Specifically, the housing 110 of the embodiment further includes an upper casing 115 and a lower casing 117. A space between the upper casing 115 and the lower casing 117 of the housing 110 defines an accommodation area A. More specifically, the accommodation area A may be divided into a first area A1 and a second area A2. The space between an edge connecting line of the fans 152, 154 (i.e., a connecting line of the two air outflow sides) adjacent to the first side plate 111 of the housing 110 and an edge connecting line of the fans 156, 158 (i.e., a connecting line of the two air outflow sides) adjacent to the second side plate 113 of the housing 110 is defined as the first area A1. The light source module 120, the optical engine module 130a, and the fans 152, 154, 156, 158 are at least located in the first area A1, and the projection lens 140 is at least located in the second area A2. The first air inlet 112 is disposed on a rear plate 119 of the housing 110, and the second air inlet 114 is located below the projection lens 140. In other words, the projection lens 140 corresponds to a position of the lower casing 117 of the housing 110. The rear plate 119 is respectively connected to the first side plate 111 and the second side plate 113. As shown in FIG. 2, the airflow direction D1 of the first air inlet 112 of the embodiment is substantially perpendicular to the airflow direction D2 of the air outlets 116, 118, and the airflow direction D3 of the second air inlet 114 is also substantially perpendicular to the airflow direction D2 of the air outlets 116, 118. Accordingly, an air flow in the projection device 100*a* of the embodiment sequentially flows through the first air inlet 112, the light source module 120, the fans 152, 154, 156, 158, and the air outlets 116, 118. Herein, a throw ratio (i.e., projection distance/image width) of the projection lens 140 is 0.4 or less. This means that the projection lens 140 of the embodiment is specifically an ultra-short throw lens, and the fans 152, 154, 156, 158 are low static-pressure and high-airflow axial fans (having a size of 85 mm×85 mm×25 mm, for example), but the invention is not limited thereto.

The light source module 120 of the embodiment is closely adjacent to the first air inlet 112, the fans 152, 154, 156, 158 are located closely adjacent to the air outlets 116, 118, and the airflow directions D1, D3 of the first air inlet 112 and the second air inlet 114 are not parallel to the airflow direction D2 of the air outlets 116, 118. Therefore, when a cooling airflow enters the housing 110 via the first air inlet 112 and the second air inlet 114, the light source module 120 and the projection lens 140 can be directly cooled. Moreover, the heated airflow inside the housing 110 is discharged through active heat dissipation of the fans 152, 154, 156, 158 to thereby achieve the effect of cooling the inside of the projection device 100*a*. Compared to the related art where high static-pressure and low-airflow blowers are used as the system fans and it is required to dispose two axial fans at a position of the light source module relatively adjacent to the projection lens, the projection device 100*a* of the embodiment adopts axial fans as the system fans and it is not required to dispose heat dissipation fans at a position of the light source module 120 relatively adjacent to the projection lens 140. Therefore, noise can be effectively reduced (i.e., a reduction of 2 dB(A) to 3 dB(A)), and the system depth (i.e., the vertical distance from the upper casing 115 to the lower casing 117) can be reduced, thereby providing an advantage of a reduced size. Moreover, since the system depth of the projection device 100*a* of the embodiment can be effectively reduced, installation is more convenient and the airflow entering via the first air inlet 112 of the rear side (i.e., the rear plate 119) can be smoother. It is noted that, in other unillustrated embodiments, it is also possible that the housing includes only one air inlet (i.e., the first air inlet), which still falls in the scope to be protected by the invention.

Referring to FIG. 2, FIG. 4, and FIG. 5, the light source module 120 of the embodiment includes a light source 122 and a light source heat dissipation module 124. Specifically, the light source 122 is connected to the light source heat dissipation module 124, and the light source heat dissipation module 124 is located closely adjacent to the first air inlet 112. More specifically, the light source heat dissipation module 124 includes a light source dissipation fin 125 and at least one heat pipe 127. A first end 127*a* of the at least one heat pipe 127 is connected to the light source 122, and a second end 127*b* of the at least one heat pipe 127 passes through the light source dissipation fin 125. Preferably, an extension direction L1 of the at least one heat pipe 127 is perpendicular to a light-transmitting direction L2 of the projection lens 140.

Furthermore, referring to FIG. 4, FIG. 5, and FIG. 6, the optical engine module 130*a* of the embodiment includes a light-modulating device 132. The light-modulating device 132 includes a light-modulating surface 135, and the light-modulating device 132 is correspondingly supported on a supporting surface 133 of the optical engine module 130*a*. An extension direction L of the supporting surface 133 is substantially parallel to the lower casing 117 of the housing 110. Herein, the light-modulating device 132 is, for example, a digital micromirror device (DMD). Of course, in other unillustrated embodiments, the extension direction of the supporting surface corresponding to the light-modulating device may also be parallel to the upper casing of the housing, which still falls in the scope to be protected by the invention. Moreover, the optical engine module 130*a* may further include an optical engine dissipation fin 134. The optical engine dissipation fin 134 is disposed above the supporting surface 133 corresponding to the light-modulating device 132 and is located between the upper casing 115 and the light-modulating device 132. Preferably, an orthogonal projection of the light source dissipation fin 125 of the light source heat dissipation module 124 on a reference plane P partially overlaps with an orthogonal projection of the optical engine dissipation fin 134 of the optical engine module 130*a* on the reference plane P. The reference plane P is, for example, a plane formed of the light-transmitting direction L2 of the projection lens 140 and the extension direction L1 of the at least one heat pipe 127 of the light source heat dissipation module 124. In other embodiments, the reference plane P may also be, for example, a plane parallel to the upper casing 115 or the lower casing 117 of the housing 110. The second end 127*b* of the at least one heat pipe 127 of the light source heat dissipation module 124 is below the supporting surface 133 corresponding to the light-modulating device 132 of the optical engine module 130*a*. On the other hand, to enhance the heat dissipation efficiency of the projection device 100*a*, referring to FIG. 7, the optical engine module 130*a* of the embodiment further includes an auxiliary fan 136. The auxiliary fan 136 is disposed inside the optical engine dissipation fin 134 and can effectively enhance the heat dissipation efficiency. Of course, the optical engine module 130*a* also includes a light combining element (not shown), a light uniformizing device (not shown), or a color filter wheel (not shown), which shall not be repeatedly described here.

Since the optical engine dissipation fin 134 and the light source dissipation fin 124 of the embodiment are not located on the same plane, there is a larger space for disposing the light source dissipation fin 124, and more and larger light source dissipation fins 124 can be disposed to increase the heat dissipation area. Thereby, flow resistance can be reduced and the heat dissipation efficiency of the light source module 120 can be enhanced. Moreover, the optical engine dissipation fin 134 is directly disposed above the light-modulating device 132. Therefore, it is not required to dispose a heat pipe to conduct the heat away, and a decrease in the heat dissipation performance resulting from inverse gravity does not occur. In addition, since the optical engine dissipation fin 134 is directly disposed above the light-modulating device 132, the arrangement of the light source module 120 may be retreated towards a direction away from the rear plate 119, which increases the distance between the first air inlet 112 of the rear plate 119 and a projection screen and is favorable for installation of cables disposed on the rear plate 119.

Furthermore, referring to FIG. 2 again, the projection device 100*a* of the embodiment further includes a plurality of speakers 162, 164 (two speakers 162, 164 are illustrated in the embodiment). The speakers 162, 164 are disposed inside the housing 110 and are located by two opposite sides of the projection lens 140. Particularly, the speakers 162, 164 of the embodiment are at least located in the second area A2 of the housing 110. More specifically, the volume of the speakers 162, 164 of the present embodiment in the second area A2 is larger than 0.5 times of the whole volume of the speakers 162, 164. In other words, the speakers 162, 164 can be fully disposed in the second area A2 or mostly disposed in the second area A2. Herein, as shown in FIG. 2, the speakers 162, 164 of the present embodiment are located in the first area A1 and the second area A2. First portions 162a, 164a of the speakers 162, 164 in the first area A1 are far smaller than second portions 162b, 164b in the second area A2. Preferably, an orthogonal projection area of the first portions 162a, 164a of the speakers 162, 164 in the first area A1 on air intake sides 152a, 156a of the relatively adjacent fans 152, 156 is smaller than the area of the air intake sides 152a, 156a. In other words, the speakers 162, 164 of the embodiment specifically have structures of large speakers, and the arrangement of the speakers 162, 164 does not block the air outlets 116, 118 and does not interfere with circulation of the airflow. Namely, the size and the arrangement of the speakers 162, 164 of the embodiment do not affect the overall heat dissipation efficiency. Moreover, the projection device 100a of the present embodiment further includes a power supply 170. The power supply 170 is disposed inside the housing 110 and is located between the optical engine module 130a and the air outlet 116.

It is noted that the reference numerals and part of the description of the embodiment above apply to the embodiments below. The same reference numerals represent the same or similar components, and descriptions of the same technical contents are omitted. Reference may be made to the embodiment above for the omitted descriptions, which shall not be repeated in the embodiments below.

Figure 8:
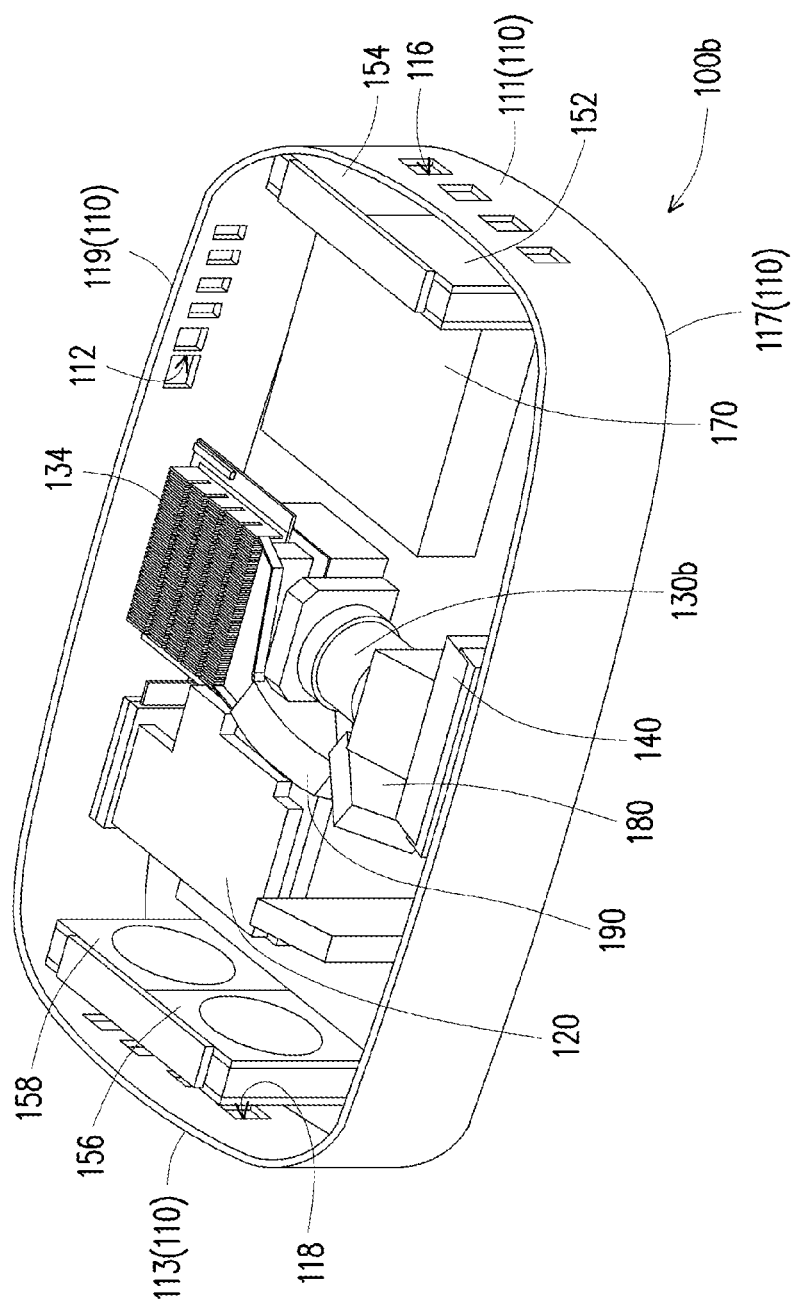
FIG. 8 is a three-dimensional diagram illustrating another projection device according to an embodiment of the invention.

FIG. 8 is a three-dimensional diagram illustrating another projection device according to an embodiment of the invention. Referring to both FIG. 2 and FIG. 8, a projection device 100b of the present embodiment is similar to the projection device 100a in FIG. 2. The difference between the two lies in that the optical engine module 130a in FIG. 2 does not include an auxiliary fan disposed inside the optical engine dissipation fin 134. Specifically, the projection device 100b of the present embodiment further includes an auxiliary fan 180 and at least one airflow guide member 190 (only one is schematically illustrated here). The auxiliary fan 180 and the airflow guide member 190 are disposed inside the housing 110, and the airflow guide member 190 is located between the auxiliary fan 180 and the optical engine dissipation fin 134 of an optical engine module 130b. The purpose of disposing the airflow guide member 190 is to guide the air of the auxiliary fan 180 to the optical engine dissipation fin 134 of the optical engine module 130b to thereby enhance the heat dissipation efficiency of the projection device 100b.

Figure 9:
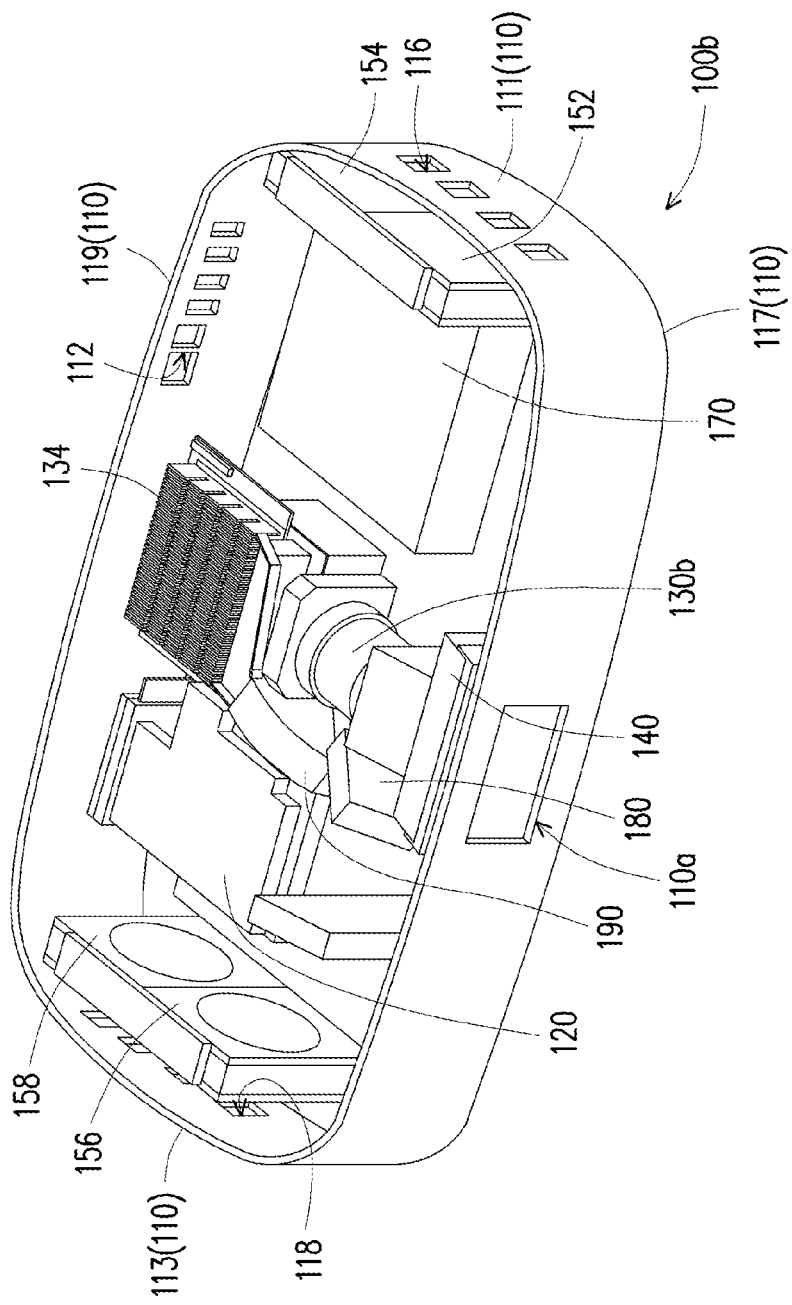
FIG. 9 is a three-dimensional diagram illustrating another projection device according to an embodiment of the invention.

FIG. 9 is a three-dimensional diagram illustrating another projection device according to an embodiment of the invention. Referring to both FIG. 8 and FIG. 9, the projection device 100b of the embodiment is similar to the projection device 100b in FIG. 8. The difference between the two lies in that the housing 110 in FIG. 9 further includes a third air inlet 110a. Specifically, the third air inlet 110a of the projection device 100b of the embodiment is disposed on a front plate (unlabeled) of the housing 110 opposite to the rear plate 119, and the projection lens 140 is located closely adjacent to the third air inlet 110a. The purpose of disposing the third air inlet 110a is to directly dissipate heat of the projection lens 140 to thereby enhance the heat dissipation efficiency of the projection device 100b.

In summary of the above, the embodiments of the invention at least exhibit one of the advantages or effects below. In the design of the projection device of the invention, the extension direction of the supporting surface corresponding to the light-modulating device is parallel to the upper casing or the lower casing of the housing, the optical engine dissipation fin is disposed above the supporting surface corresponding to the light-modulating device, and the light-modulating device is located between the optical engine dissipation fin and the light source dissipation fin. In other words, since the optical engine dissipation fin and the light source dissipation fin are not located on the same plane, there is a larger space for disposing the light source dissipation fin, and more and larger light source dissipation fins can be disposed to increase the heat dissipation area. Moreover, the optical engine dissipation fin is directly disposed above the light-modulating device. Therefore, it is not required to dispose a heat pipe to conduct heat as in the related art, and a decrease in the heat dissipation performance resulting from inverse gravity does not occur. In brief, the projection device of the invention exhibits improved heat dissipation effect.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projection device comprising a housing, a light source module, an optical engine module, and a projection lens, wherein the housing comprises an upper casing and a lower casing;

the light source module is disposed inside the housing and comprises a light source and a light source heat dissipation module connected to the light source, wherein the light source heat dissipation module comprises a light source dissipation fin;

the optical engine module is disposed inside the housing and is located on a light transmission path of a light emitted from the light source, the optical engine module comprises a light-modulating device and an optical engine dissipation fin, the light-modulating device is correspondingly supported on a supporting surface of the optical engine module, and an extension direction of the supporting surface is parallel to the upper casing or the lower casing of the housing, wherein the optical engine dissipation fin is disposed above the supporting surface corresponding to the light-modulating device, and the light-modulating device is located between the optical engine dissipation fin and the light source dissipation fin; and the projection lens is disposed inside the housing and is connected to the optical engine module.

2. The projection device according to claim 1, wherein an orthogonal projection of the light source dissipation fin on a reference plane partially overlaps with an orthogonal projection of the optical engine dissipation fin on the reference plane.

3. The projection device according to claim 1, wherein the light source heat dissipation module further comprises at least one heat pipe, a first end of the at least one heat pipe is connected to the light source, a second end of the at least one heat pipe passes through the light source dissipation fin, and an extension direction of the at least one heat pipe is perpendicular to a light-transmitting direction of the projection lens, the second end of the at least one heat pipe is below the supporting surface corresponding to the light-modulating device of the optical engine module.

4. The projection device according to claim 1, wherein the optical engine dissipation fin is located between the upper casing and the light-modulating device.

5. The projection device according to claim 1, wherein the housing comprises at least one air inlet and a plurality of air outlets, wherein the air outlets are respectively located on a first side plate and a second side plate of the housing, and an airflow direction of the at least one air inlet is not parallel to an airflow direction of the air outlets.

6. The projection device according to claim 5, wherein the at least one air inlet comprises a first air inlet and a second air inlet, the light source heat dissipation module is located closely adjacent to the first air inlet, and the second air inlet is located below the projection lens.

7. The projection device according to claim 6, wherein the first air inlet is disposed on a rear plate of the housing, and the second air inlet is disposed on the lower casing of the housing and corresponds to the projection lens.

8. The projection device according to claim 5, further comprising:
a plurality of fans disposed inside the housing and respectively located closely adjacent to the air outlets.

9. The projection device according to claim 8, wherein the upper casing and the lower casing of the housing define an accommodation area, the accommodation area is divided into a first area and a second area, a space between an edge connecting line of a part of the fans adjacent to the first side plate of the housing and an edge connecting line of another part of the fans adjacent to the second side plate of the housing is defined as the first area, the light source module, the optical engine module, and the fans are at least located in the first area, and the projection lens is at least located in the second area.

10. The projection device according to claim 9, further comprising:
a plurality of speakers disposed inside the housing and located by two opposite sides of the projection lens, wherein the speakers are at least located in the second area.

11. The projection device according to claim 10, wherein a volume of each of the speakers in the second area is larger than 0.5 times of a volume of each of the speakers.

12. The projection device according to claim 10, wherein the speakers are located in the first area and the second area, a first portion of each of the speakers in the first area is far smaller than a second portion of each of the speakers in the second area.

13. The projection device according to claim 12, wherein an orthogonal projection area of the first portion of each of the speakers in the first area on an air intake side of one of the relatively adjacent fans is smaller than an area of the air intake side.

14. The projection device according to claim 5, wherein the at least one air inlet comprises a third air inlet, and the projection lens is located closely adjacent to the third air inlet.

15. The projection device according to claim 8, wherein the fans are axial fans.

16. The projection device according to claim 8, wherein the fans comprise a first fan and a second fan, an air outflow side of the first fan is aligned with the air outlet located on the first side plate, and an air outflow side of the second fan is aligned with the air outlet located on the second side plate.

17. The projection device according to claim 1, wherein the optical engine module further comprises an auxiliary fan disposed inside the optical engine dissipation fin.

18. The projection device according to claim 1, further comprising:
a power supply disposed by one side of the optical engine module.

19. The projection device according to claim 1, further comprising:
an auxiliary fan disposed inside the housing; and
at least one airflow guide member disposed inside the housing and located between the auxiliary fan and the optical engine module.

20. The projection device according to claim 1, wherein a throw ratio of the projection lens is 0.4 or less.

* * * * *